United States Patent [19]
Buchanan

[11] 4,072,938
[45] Feb. 7, 1978

[54] BUCKET BRIGADE ANALOG-TO-DIGITAL CONVERTER

[75] Inventor: James E. Buchanan, Bowie, Md.

[73] Assignee: Westinghouse Electric Corporation, Pittsburgh, Pa.

[21] Appl. No.: 607,413

[22] Filed: Aug. 25, 1975

[51] Int. Cl.² .......................................... H03K 13/17
[52] U.S. Cl. .......................................... 340/347 AD
[58] Field of Search .................. 340/347 AD; 357/24; 307/235 N, 235 P, 304, 221 D

[56] References Cited

U.S. PATENT DOCUMENTS

| | | | |
|---|---|---|---|
| 3,599,204 | 8/1971 | Severin | 340/347 AD |
| 3,903,543 | 9/1975 | Smith | 340/347 AD |
| 3,930,255 | 12/1975 | Means | 340/347 AD |

Primary Examiner—Charles D. Miller
Attorney, Agent, or Firm—H. W. Patterson

[57] ABSTRACT

A bucket brigade analog-to-digital converter, which is a charge coupled analog-to-digital device that is made up of successive stages with each stage in one aspect including potential wells, and in another aspect including capacitors is disclosed. The charge or portion thereof in each stage is passed on to each successive stage in response to clock pulses, and compared in each stage with a different predetermined reference charge or voltage. The comparator output of each stage constitutes one bit of digital data.

12 Claims, 6 Drawing Figures

BUCKET BRIGADE ANALOG-TO-DIGITAL CONVERTER

BACKGROUND OF THE INVENTION

There are several well known types of conventional analog-to-digital converters that have been in use or proposed for various applications. These include types utilizing techniques known as dual slope integration, parallel comparison, voltage to frequency conversion, successive approximation, and serial cascade, for example. Each of these types offers certain advantages for different types of applications and construction. They also have certain inherent disadvantages which render them infeasible or uneconomical for certain uses. For example, one type may be unreliable, expensive to build, or may be too slow in its operation. The disadvantage of such conventional analog-to-digital converters when used for signal processing applications where signal frequency content is important, is the necessity of utilizing well known sample and hold circuits in order to establish a definitive sample-to-sample relationship with a known precise time between samples. Such conventional converters without the sample and hold circuit provide a digital output, which may correspond to a value equal in magnitude to the value of a signal that existed some time between the start of the conversion and the completion of the conversion. Also, in order to be acceptable for signal processing applications, conventional analog-to-digital converters provide complications to a greater or lesser extent when attempting to fabricate them by integrated circuit techniques.

The term "bucket brigade" has been used in the art to describe a type of circuit, where sampled values of a signal are stored in the form of charges in a series of capacitors. Between each of the storage capacitors is a type of switch that is controlled by a clock pulse to transfer the charge from one capacitor to the next, as buckets of water are passed along the line in old methods of fire fighting. Various bucket brigade circuits and their theory of operation is described in Vol. 31, No. 4 of Phillips Technical Review, published in 1970 by F. L. J. Sangster and entitled the "Bucket Brigade Delay Line", a shift register for analogue signals.

Recently, bucket brigade charge coupled circuits have been applied to electrical signal filtering applications. A digital bucket brigade passes a binary signal, a high or a low level, serially through discrete stations or stages with the signal at a station or stage "N" moving to stage "N + 1" in response to each application of some externally applied clock pulse. An analog bucket brigade operates as the digital, except an analog level rather than a high or low level is passed down the line on each application of the clock pulse. In either case, the bucket brigade circuit is an arrangement of components that transfers a given amount of charge from one stage to the next on each application of the external clock; and holds that charge in some form of memory until the next application of the clock. An analogue shift register which operates on the principal of electric charge transfer is described in detail in U.S. Pat. No. 3,643,106 to Berwin et al issued on Feb. 15, 1972.

It is well known that charge coupled circuitry may be readily implemented using low cost integrated circuit techniques. An article entitled "The A, B, C's of CCD's" by Walter F. Kosonocky and Donald J. Sauer published in Electronic Design VIII on Apr. 12, 1975 describes in detail the various methods of fabricating charge coupled devices. U.S. Pat. No. 3,877,056 issued on Apr. 8, 1975 to Bailey points out the advantages and utility of charge transfer devices for signal processing systems. A detailed discussion of charge coupled device technology and its particular applications, is also described in a paper by G. F. Amelio entitled "Physics and Applications of Charge Coupled Devices", in the 1973 IEEE INTERCON Technical Program Papers, Session 6, Paper 1–3.

Although, certain applications of bucket brigage circuits and charge coupled devices are well known, analog-to-digital converters which can be readily fabricated as an integrated circuit, and which eliminates the necessity of sample and hold circuits for signal processing application where signal frequency content is important utilizing such techniques, have not been disclosed, as far as is known.

SUMMARY OF THE INVENTION

Broadly, the present invention relates to an analog-to-digital converter where all or a portion of a charge is stored and transferred from one storage device to the next. The amount of each charge transfer determines the value of each binary bit of the unknown analog voltage. Clock pulses transfer the charge or a portion thereof from one storage device to the next, and determine the precise time and speed of conversion.

More specifically, the analog-to digital converter which provides a binary output that is indicative of an unknown analog input, includes a series of charge coupled conversion stages that correspond to the number of bits of digital information required for a particular application. Each of the conversion stages includes a reference, which is of a different predetermined value, in accordance with the reference value of the preceding conversion stage. The analog input to each stage is compared to the reference value by a comparator, which comparison determines the binary bit for that stage. The output of the comparator generates a signal of one level when the analog output of the preceding stage exceeds the reference source, and generates a signal of another level when the analog output of the preceding stage is less than the reference source. An electronic storage device, which may be either a conventional capacitor or potential well, stores the analog value to be passed on to the next stage. A clock pulse operates two electronic switches at a predetermined frequency. One of the electronic switches couples the electronic storage device to the electronic storage device of the preceding stage at precise times in response to a clock pulse. The second electronic switch of each stage, which is driven by this same clock pulse, controls the storage device of its particular stage to store an analog value, which corresponds to the analog input value less the value of the reference, at times when the analog input exceeds the reference value; and to store an analog value corresponding to the analog input value at times when such value is less than the reference source. A parallel input serial output shift register may be utilized to provide the binary output, or any of many other well known logic techniques for collecting skewed digital data.

In one aspect, the improved analog-to-digital converter may be of the type where an unknown analog voltage is transferred from one stage to the next; and in another aspect, it may be of the type wherein a "charge" or a portion thereof is swept from one potential well to the next.

DESCRIPTION OF THE PREFERRED EMBODIMENT

Figure 1:
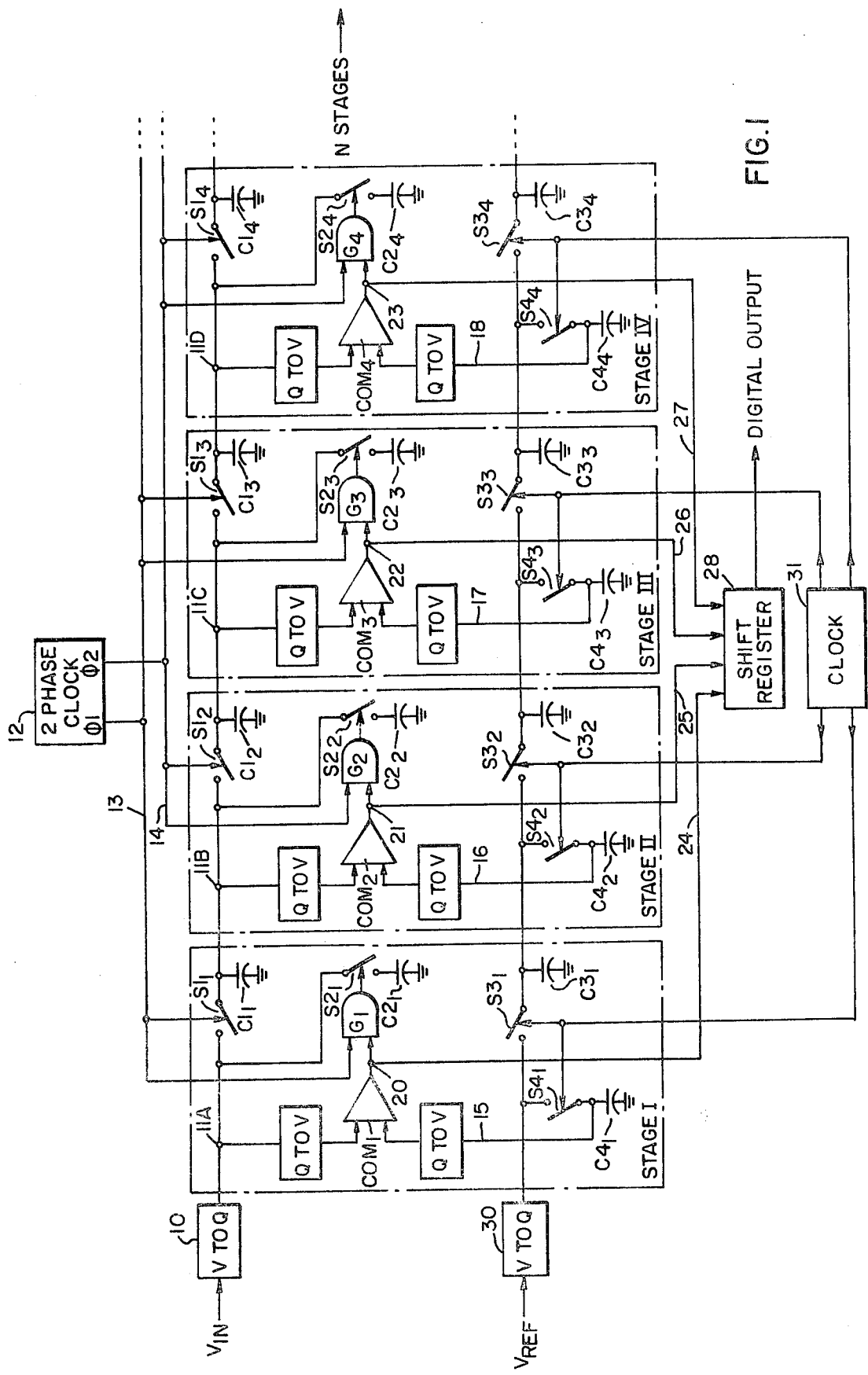
FIG. 1 is a schematic representation of an improved bucket brigade analog-to-digital converter utilizing potential wells according to one embodiment of the invention

Referring to FIG. 1, a schematic representation of a charge coupled bucket brigade analog-to-digital converter according to one embodiment of the invention is illustrated to include the detail of four stages. Each of the stages is described as including components which are enclosed by dashed lines, and referred to as Stage I, Stage II, Stage III, and Stage IV. Similar types of components for each stage are referred to by their appropriate legend, where a reference numeral is not used; and their particular stage location is indicated by an appropriate subscript corresponding to the numerical stage designation. For example, Stages I through IV each include well known storage devices such as MOS capacitors or potential wells referred to as C1 and C2. The MOS capacitors associated with Stage I are referred to as $C1_1$ and $C2_1$. The MOS capacitors associated with Stage II are referred to as $C1_2$ and $C2_2$, and so forth. More or less stages may be used depending on the particular application. Each stage of the converter includes a serially connected analog input and output referred to generally as 11A, 11B, 11C and 11D.

An unknown analog input voltage to be converted, referred to as $V_{IN}$ is applied to a conventional voltage to charge converter 10 at the analog input of Stage I. A conventional two phase clock 12 generates complementary pulses at a predetermined frequency such as between one hundred kilohertz and one megahertz, for example. Phase 1 pulses are shown as actuating components of the odd numbered stages over a line 13; and phase 2 pulses are shown as actuating components of even numbered pulses over a line 14. Each stage of the converter is comprised of a comparator COM which compares at its input an unknown charge on line 11 with a predetermined reference charge on respective lines 15, 16, 17, and 18. The comparator COM may be conventional voltage comparators which are coupled at their inputs to a reference charge, described hereinafter, and the unknown analog input on line 11. The comparators COM are so constructed that a signal which is either high level or low level appears at their respective outputs 20, 21, 22, and 23 depending on whether or not the charge on lines 11A, 11B, 11C and 11D exceeds the reference charge on the associated lines 15, 16, 17, and 18. The output of the comparators COM are respectively coupled electrically by lines 24, 25, 26, and 27 to a shift register 28. The shift register 28 may be any conventional type, preferably of the parallel input serial output type to collect, order, and produce the binary digital output as a function of the high or low level signals on the comparator output.

The unknown charge or a portion thereof on the analog line 11 is coupled through a switch S1 for each stage and stored by the MOS capacitor in each of the stages, C1 upon the closing of switch S1. The electronic switches S1 may be well known potential well electrodes used in CCD integrated circuits. The charge or a portion thereof is transferred over the analog output lines 11A, 11B, 11C and 11D to the MOS capacitor or potential well C1 in the next succeeding stage upon the closing of the gate S1 of the succeeding stage and opening of the switch S1 of the preceding stage. One switch clocking arrangement is as follows: one phase of the 2 phase clock 12 closes alternate stage switches $S1_1$ and $S1_3$ at the same time the alternate even stage switches $S1_2$ and $S1_4$ open upon cessation of phase 2 clock pulses. Similarly, phase 2 pulses closes alternate switches $S1_2$ and $S1_4$ while gates or switches $S1_1$ and $S1_3$ open upon cessation of phase 1 clock pulses.

Figure 5:
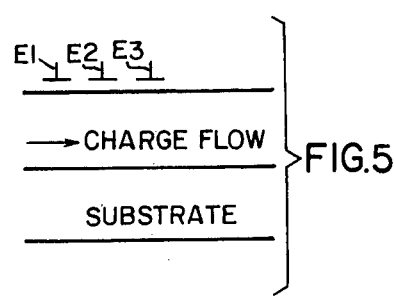
FIG. 5 illustrates diagrammatically a potential well having three electrode gates, which may be used in accordance with the present invention.
Figure 6:
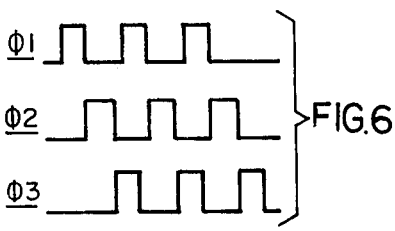
FIG. 6 shows horizontally a three phase clock output for the potential well of FIG. 5.

Referring to FIG. 5, an alternate clocking arrangement could be used where the switches S1 and S2 are made up of multi-electrode gates; that is, either two, three or four electrodes with multi-phase clocks, one phase for each electrode E1, E2, and E2, which phases are applied in sequence to control the direction and flow of the charge. A given clock phase $\phi1$, $\phi2$, and $\phi3$, as shown in FIG. 6 is applied to similarly positioned electrodes in all the gates at the same time. Such charge control techniques are well known and described in the publications referenced herein. The particular choice of the various charge control clocking schemes depends on the choice of various charge coupled integrated circuit fabrication techniques selected in fabricating the analog-to-digital converter, and does not affect the basic mode of operation of the converter.

Whether or not all or a portion of the charge being passed along is stored in the device C1 at times when its corresponding gate S1 closes depends on the operation of the electronic switch, or gate electrodes S2 for each of the stages.

An AND gate G associated with each of the stages has one input electrically connected to either clock pulse phase 1 or 2 over representative line 13 or 14 and its other input electrically responsive to the output of its associated comparator COM. In response to a clock pulse and a high level signal occurring at the same time from its associated comparator COM, the AND gate G conducts to close an electronic switch S2 to couple a storage device C2 to the analog line 11. The switch S2 remains open at times when the comparator COM generates a low level signal indicating that the analog input charge on line 11 does not exceed the reference charge on its associated input 15, 16, 17 or 18. The storage devices or potential wells $C2_1$ through $C2_4$ previously described are of such a configuration that they will each accept a predetermined different maximum charge. For example, the potential well $C2_1$ under the electronic gate $S2_1$ is configured to store a maximum charge that is equal to one-half of the maximum incoming charge or maximum range of the unknown analog input voltage $V_{IN}$. The potential well $C2_2$ beneath the gate $S2_2$ is sized to store a maximum charge equivalent to one-half of the maximum charge of the potential well $C2_1$. The potential well $C2_3$ is of such a size to store a maximum charge that is one-half of the maximum charge of $C2_2$ in the preceding stage; and similarly, $C2_4$ is sized to store a maximum charge equivalent to one-half of the maximum charge of $C2_3$ in the preceding stage. The relationship between the sizes of the potential wells would be the same for each succeeding stage N of the analog-to-digital converter.

The reference charge which is compared by each comparator COM is equivalent to the maximum charge for the potential well C2 in its associated stage. The reference charge on representative inputs 15, 16, 17 and 18 for respective conversion Stages I through IV may be generated in a number of ways. As shown functionally in FIG. 1, the reference voltage for each stage is generated by utilizing storage devices C3 and C4 with associated electronic gates S3 and S4. A reference voltage $V_{REF}$ corresponding to the maximum analog input voltage is converted to an equivalent charge by a conventional voltage to charge converter 30. The circuitry for generating the reference levels which also lends itself to integrated circuit configurations includes storage devices, which may be MOS capacitors or potential wells C3 and C4 and associated gates or electrodes S3 and S4. These gates S3 and S4 may be conventional charge transfer gates or electrodes similar to electronic switches S1 and S2; and are operated repetitively and simultaneously by clock pulses from a clock 31 which may be the same clock 14, of a frequency that may vary from 100 kilohertz to 1 megahertz, for example, so that the reference charges exist at all times. When the switches S3 and S4 close, the charge from the voltage to charge converter 30 is split, with half of the charge being absorbed by $C3_1$, and the other half being absorbed by $C4_1$ of Stage I. The charge that is absorbed by $C3_1$ is swept on one-half to $C3_2$ and one-half $C4_2$. The charge absorbed by $C3_2$ is swept on one-half to $C3_3$ and one-half to $C4_3$, and so forth for each stage of the A to D converter reference generator. In each stage, the potential well C4 drains off half of the charge, which provides a reference level for each stage of the analog-to-digital converter which is equivalent to one-half of the reference of the preceding stage.

With reference to the converter circuitry of Stage I, for example, an incoming charge from the voltage to charge converter 10 with the gate S2 closed, will first be absorbed or stored in the potential well $C2_1$ with the remainder being swept on to be stored or absorbed in the potential wells $C1_1$ during the time that the electronic switch $S1_1$ is closed. When switch $S2_1$ is open, the closing of the switch $S1_1$ results in the entire charge from the converter 10 being absorbed by the potential well $C1_1$. Similarly, for stage II, when the gate $S2_2$ is open, the entire charge from the potential well $C1_1$ is transferred to $C1_2$ when the switch $S1_2$ closes. When the switch $S2_2$ is closed together with the switch $S1_2$, the charge from $S1_1$ is absorbed fully by $C2_2$ and the remainder is swept on to $C1_2$. Similarly, the potential well $C1_3$ and $C1_4$ receive the remaining charge after the wells $C2_3$ and $C2_4$ are full if the respective gates $S2_3$ and $S2_4$ are closed; and the wells $C1_3$ and $C1_4$ receive the entire incoming charge upon the closure of gates $S1_3$ and $S1_4$ with the gates $S2_3$ and $S2_4$ open. Such an arrangement of the potential wells C1 and C2, as well as the arrangement of C3 and C4 of the reference generator, is well known and described in a publication prepared for the Office of Naval Research and distributed by the National Technical Information Service of the U.S. Department of Commerce entitled "Charge Coupled Devices in Signal Processing Systems", Vol. 1, Dated July, 1974.

Figure 4:
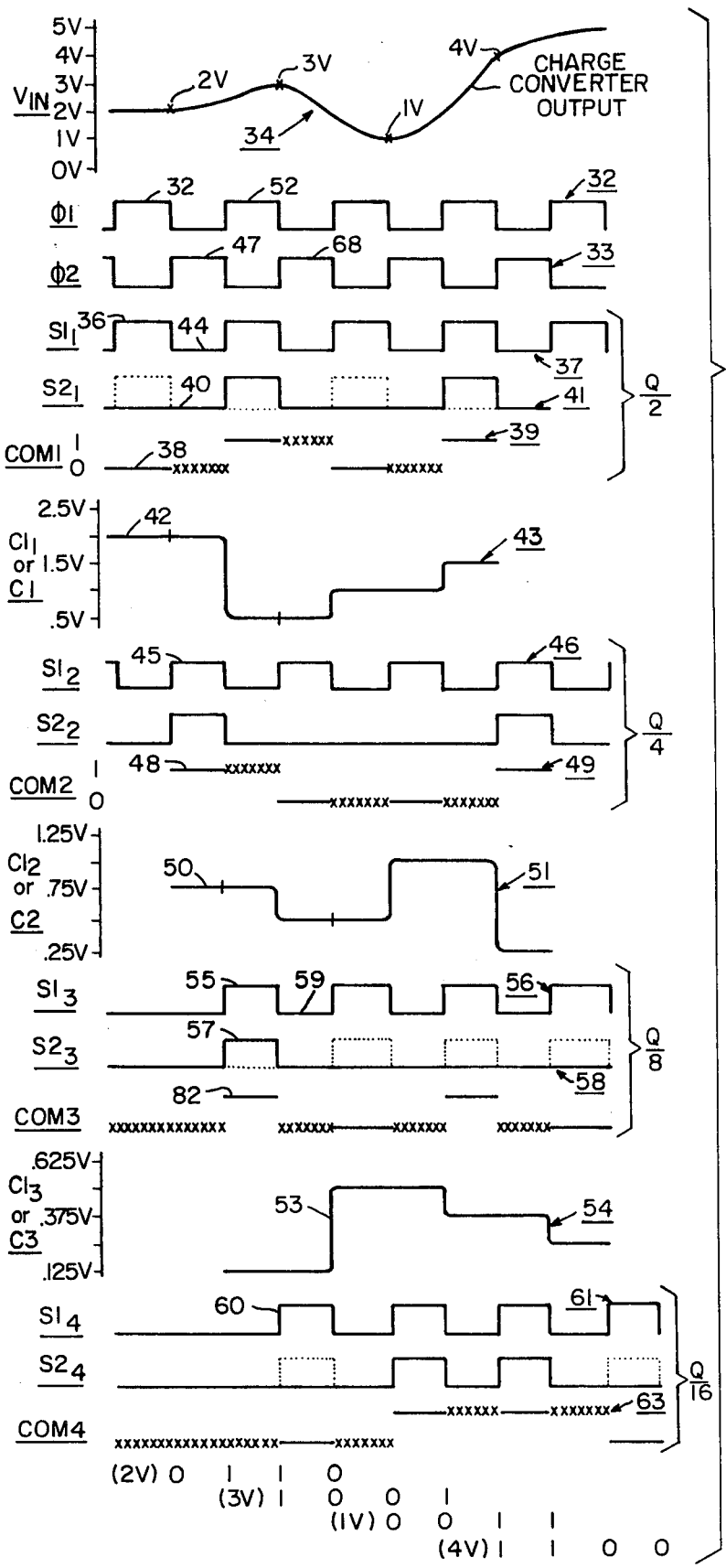
FIG. 4 is a graphic representation of the typical operation of the embodiments of FIGS. 1 and 2.

A description of the operation of the analog-to-digital converter for typical voltages will be given in connection with the description of FIG. 4.

Figure 2:
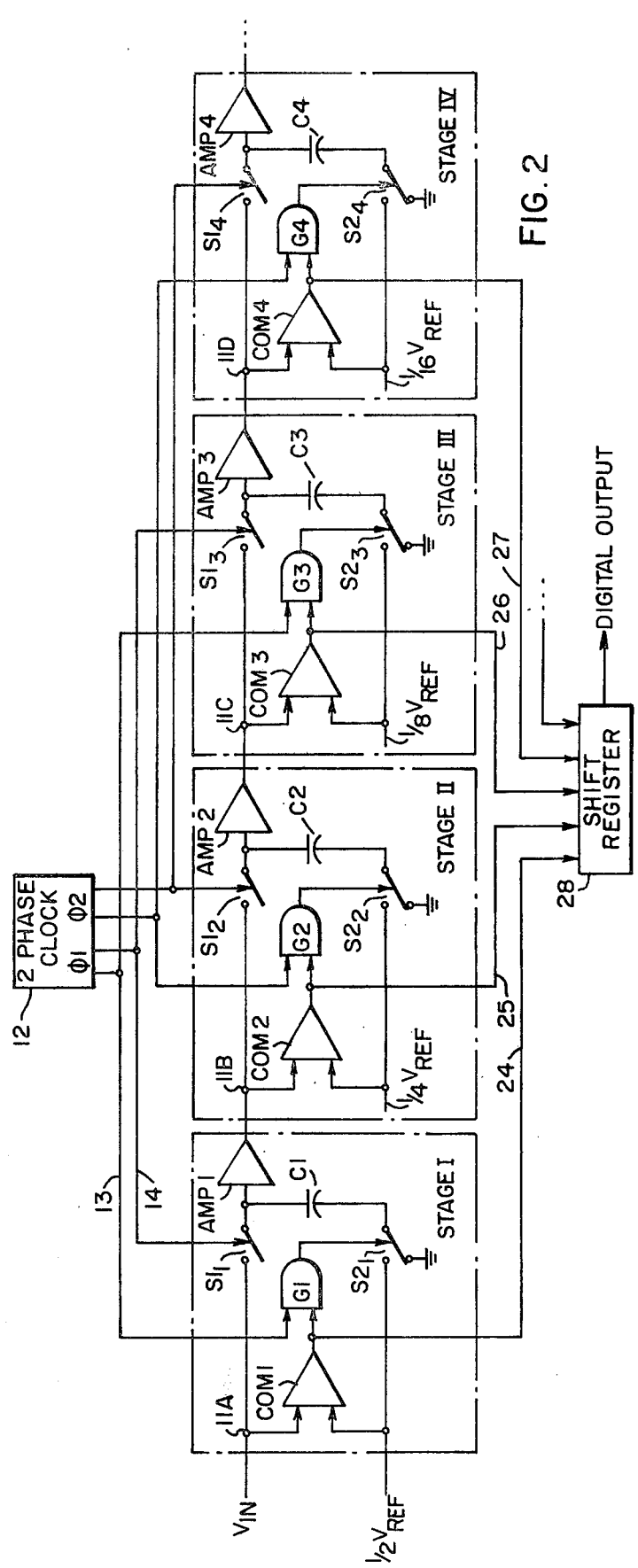
FIG. 2 is a schematic representation of an improved bucket brigade analog-to-digital converter utilizing capacitors according to another embodiment of the invention.

Referring to FIG. 2 which is a schematic functional representation of a bucket brigade analog-to-digital converter according to another embodiment of the invention, utilizes conventional capacitors C and amplifiers AMP rather than the MOS capacitors or potential wells C1 and C2 described in connection with FIG. 1.

The analog-to-digital converter of FIG. 2 is also shown to include four stages illustrated in detail, which are included within the dashed lines and appropriately labeled State I through Stage IV Inclusive. The components of each stage are also similarly legended with each legend bearing a subscript corresponding to the particular stage in which it is located. Each of the conversion stages also includes an electronic switch S1 for transferring all or a portion of the charge in response to pulses of the 2 phase clock. Alternate conversion stages are driven by one phase of the clock and the intermediate stages are driven by the other phase over lines 13 and 14. The switch S1 transfer all of or a portion of the unknown analog voltage on line 11 from one stage to the next through respective amplifiers AMP electrically coupled in series with analog input line 11 between switches S1 in successive stages. A voltage comparator COM is coupled at its inputs to the line 11 and the reference voltage of each respective stage to compare all or a portion of the incoming voltage from line 11 to each of the stages as determined by the operated condition of each respective electronic switch S2. Each of the switches S2 is operated through the output of its associated AND gate G in response to a clock pulse, at times when the incoming analog voltage to each respective stage is greater than the reference voltage for that stage in the same manner as FIG. 1. The manner of generating the reference voltage for each stage may be accomplished by conventional well known techniques where the reference voltage of each stage is one-half of the reference voltage for the preceding stage, with the first stage being equivalent to one-half of the maximum voltage range of the incoming unknown analog voltage $V_{IN}$. Each one of the comparators COM has a respective digital output 24 through 27 which is input to the shift register 28. A capacitor C for each switch is coupled at one side through switch S2 to ground when the switch 52 is in the position shown in FIG. 2 and stores all of the voltage input to that stage on line 11 through the closed switch S1 coupled to the other side of the capacitor C. When the electronic switch S2 is closed one side of the capacitor C is coupled to the voltage reference and is charged to a value equivalent to the incoming voltage on line 11 for its respective stage less the reference voltage for such stage. The amplifiers AMP in the illustrated embodiment are all assumed to be of unity gain, and voltage sensitive. The output of each of the amplifiers AMP is conducted through the S1 switch of the next succeeding stage to charge the capacitor C associated with the succeeding stage.

Figure 3:
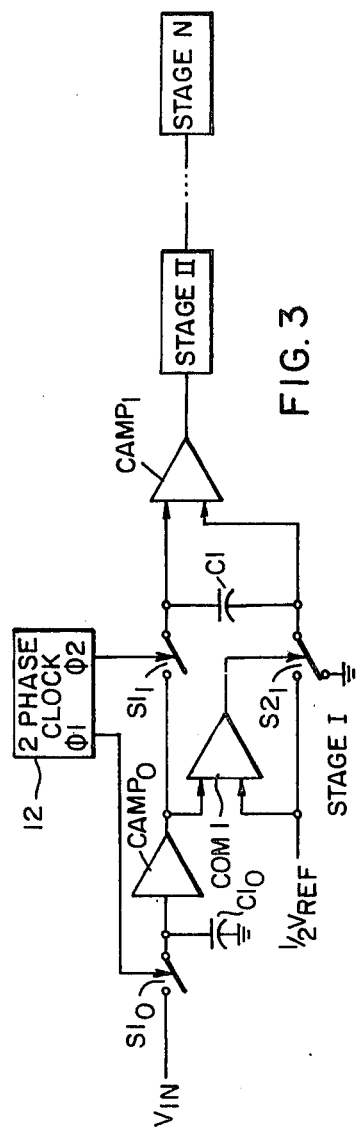
FIG. 3 illustrates schematically a modification of the embodiment of FIG. 2.

FIG. 3 illustrates a modification of the analog-to-digital converter of FIG. 2 utilizing a current sensitive amplifier CAMP for each stage rather than the charge sensitive amplifier AMP as shown in FIG. 2. In FIG. 3 the incoming analog voltage $V_{IN}$ is conducted through the amplifier CAMP in response to the closing of a switch $S1_0$ which is operated by phase 1 of the clock 14.

The switch $S1_1$ and every odd stage thereafter is driven by phase 2 of the clock 14. It is understood that the even stages of the A to D converters are operated in the same phase as the switch $S1_0$. In this embodiment, a capacitor $C1_0$ is charged with the incoming unknown voltage $V_{IN}$ upon the closure of switch $S1_0$ and the output of the amplifier CAMP is compared by the comparator COM1 to the voltage reference $V_{REF}$. The electronic switch $S2_1$ couples the voltage reference $\frac{1}{2}V_{REF}$ to the stage capacitor C1 in response to the output of the comparator COM1, which indicates that the incoming voltage from the amplifier CAMP exceeds the reference voltage $\frac{1}{2}V_{REF}$. When the incoming voltage does not exceed the reference voltage, the switch $S2_1$ couples the capacitor C1 to the ground which causes the entire charge from the amplifier CAMP to be stored by the capacitor C1 when the switch $S1_1$ closes. The amplifier CAMP senses the voltage across the capacitor C1 by way of inputs 32 and 33 for transfer to Stage II. The capacitor $C1_0$ acts as a sample and hold stage for the amplifier CAMP.

A more detailed description of the embodiments of the invention will be made in connection with the description of the timing diagram of FIG. 4 which illustrates the typical operation of the embodiments of the invention of FIGS. 1 and 2. Assuming that the unknown incoming analog voltage $V_{IN}$ has a range of zero to five volts, the reference charge for Stage I therefore, is equivalent to one-half of the maximum range of the unknown analog input voltage or 2.5 volts. The reference value for Stage II is equivalent to 1.25 volts; the reference value for Stage III is equivalent to 0.625 volts; and the reference value for Stage IV is 0.3125 volts. For more stages, each succeeding stage would be one-half of the preceding stage as previously described.

A waveform referred to at 32 represents the pulses of phase 1 of the clock 12 on the representative line referred to as 13. Waveform 33 represents the pulses of phase 2 of the clock 12 an the representative line referred to as 14. A waveform 34 represents the unknown analog voltage input applied to the voltage to charge converter 10 of FIG. 1 or directly to the input 11 of FIG. 3. In response to pulse 35 of the phase 1 waveform 32, the electronic switch $S1_1$ closes as shown by portion 36 of waveform 37, which represents the operation of the switch S1. Simultaneously, the comparator COM1 compares the charge on the line 11 of Stage I with the reference charge or voltage on line 15. Since the incoming analog voltage upon the terination of the pulse 35 is two volts, as shown by the curve 34, and the reference charge or voltage for Stage I is 2.5 volts, the output of the comparator COM1 is a low level signal as represented by portion 38 of the comparator COM1 output waveform referred to as 39. This low level signal represents the most significant bit of the binary number, which appears on line 24 at the input to the shift register 28.

Although phase one of the clock 12 provided one of the inputs to the AND gate $G_1$ the gate $G_1$ did not conduct because of the low level signal at the output of the comparator COM1. Therefore, $S2_1$ did not close as shown by portion 40 of the waveform 41 which represents the operation of switch $S2_1$. As shown by portion 42 of waveform 43 which represents the amount of the charge in the capacitor C1 or beneath the potential well of the MOS capacitor $C1_1$, the closing of the switch $S1_1$ with $S2_1$ open caused the entire charge on line 11 to be stored by capacitor C1 or by the potential well $C1_1$.

With reference to FIG. 1, because $S2_1$ is open, the MOS capacitor $C2_1$ is not coupled to line 11A of Stage I, and with reference to FIG. 2, the capacitor c1 is coupled to ground so that it absorbs the full charge.

In response to the opening of switch $S1_1$ as represented by portion 44 of the waveform 37 and the closing of switch $S1_2$ as represented by portion 45 of waveform 46, which occurs in response to pulse 47 of the waveform 33, the comparator COM2 compares the charge on the potential well $C1_1$ of Stage I which is equivalent to 2 volts with the reference charge of Stage II present on line 16 which is equivalent to 1.25 volts. Because the reference charge exceeds the charge on $C1_1$ or the reference voltage of FIG. 2 exceeds the charge on the capacitor C1, the comparator COM2 generates a high level signal at its output 21 to the input of the AND gate $G_2$, as shown by portion 48 of waveform 49 for the comparator COM2. The high level signal present on line 25 to the shift register 28 represents the second bit of the digital output for the analog value of 2 volts. For the embodiment of FIG. 1, the high level signal on the output 21 of COM2 and the presence of clock pulse 47 at the input to the AND gate $G_2$ caused $S2_2$ to close, which coupled $C2_2$ to the input 11 of Stage II which results in the charge equivalent to 1.25 volts to be absorbed by $C2_2$, which is the maximum it can store; and the remainder of the charge, which in this instance is equivalent to 0.75 volts, is swept on to $C1_2$, as shown by portion 50 of waveform 51.

For Stage III of FIG. 1, in response the occurrence of clock pulse 52 in waveform 32, and the cessation of pulse 47 of waveform 33, the comparator COM3 compares the charge in the potential well $C1_2$, which in the present example, is 0.75 volts with the reference charge on 17, which is the equivalent of .625 volts producing a high level signal to AND gate $G_3$, a high level signal to the shift register 28 over line 26, and closes the switch $S2_3$ causing the 0.75 volt charge equivalent in $C1_2$ to be absorbed by the potential well $C2_3$ to the extent of a charge equivalent to 0.625 volts with the remaining charge equivalent to .125 bolts being stored in the potential well $C1_3$ as shown by portion 53 of waveform 54 upon the closure of switch $S1_3$ represented by portion 55 of waveform 56. The closure of switch $S2_3$ previously described, is represented by portion 57 of waveform 58.

For the embodiment of FIG. 2, the .125 equivalent volt charge is stored by the capacitor C3 with the switch $S2_3$ closed by coupling the capacitor C3 to the reference voltage of 0.625 volts on the line 17.

In response to pulse of waveform 53 and the cessation of the pulse 52 of waveform 32, the switch $S1_3$ opens and $S1_4$ closes as represented by portion 59 of the waveform 56, and portion 60 of a waveform 61. This occurrence causes the charge of the potential well $C1_3$ which is .125 volts to be compared with the reference charge on line 18 of Stage IV, which is equivalent to 0.3125 volts, by the comparator COM4. Since the reference charge exceeds the charge in $C1_3$, a binary output of zero appears at the output 23 of COM4, as shown by portion 62 of waveform 63, to the input 27 of the shift register 28, which is the fourth digit of the binary output for the analog input of 2 volts. Thus, the binary equivalent for the analog input at the precise time as shown on the waveform 34 is 0110 as shown by FIG. 4.

The analog voltage corresponding to 3 volts as shown on the waveform 34 is converted in Stage I at the same time the third digit of the 2 volt sample is generated as previously described in response to the same pulse 52. This analog sample is transferred to the second stage upon the occurrence of the pulse 47 at the same time the 2 volt pulse is transferred to the fourth stage by the pulse 58. Thus, the analog samples are converted at the precise time of occurrence of one phase of the clock. The operation of the analog-to-digital converter for the analog samples shown on the waveform 34 as 3 volts, 1 volt and 4 volts, for example, is readily understood by reference to FIG. 4 in connection with the previous description. The charge on the potential well $C1_4$ (FIG. 1) or the capacitor C4 (FIG. 2) would be used for an analog-to-digital converter that included more than four stages.

The modification of FIG. 3 works in the same manner as FIG. 2 except that the amplifier CAMP senses the voltage across the capacitor C. In all embodiments, an extra transfer switch $S1_0$ and capacitor $C1_0$ as shown in FIG. 3 may be used to precisely introduce the unknown analog voltage at a given known time; and to stabilize an unknown analog voltage in the first stage of the converter.

The foregoing description, which relates to two separate embodiments and a modification of a bucket brigade analog-to-digital converter, that precisely converts and transfers a charge from one stage to the next, may still include further modifications without departing from the scope of the present invention.

For example, clock pulses of more than two phases may be utilized. The reference voltage of FIG. 2 could be the same for each stage with each of the amplifiers AMP or CAMP having a gain of two, and several different well known specific arrangements of the AND gates G and switches S1 and S2 can be fabricated. Also, each of the binary bits could be conducted from the output of the AND gate G instead of the comparator; and the AND gates, as well as the output data register can be constructed using well known CCD techniques.

It is understood that the separation of the analog-to-digital converter into several stages as described, is done for convenience of description and facility of understanding; and that each such stage or binary bit locations could be segregated differently.

What I claim is:

1. An analog-to-digital converter for providing a binary output indicative of an analog input at precise repetitive time intervals, comprising:
   a plurality of series connected electronic switches, each switch defining an individual stage of successive converter stages,
   a single electronic storage device for each individual stage, each device being coupled to store an unknown charge in response to the closing of a switch defining its associated stage,
   a reference source for each stage, each said reference source being of a different predetermined value in accordance with the reference source for the preceding stage,
   a comparator for each individual stage, each comparator being coupled at one input to one side of the electronic switch defining its respective stage and coupled at the other input to the reference source for its respective stage to compare the reference source with the unknown charge stored in the preceding stage upon the closure of the electronic switch for its respective stage,
   means for each stage governed by the comparator coupling the comparator at its output to the single electronic storage device of the stage at times when the electronic switch for such stage is closed, to either store the entire charge of the storage device of the preceding stage or a charge equivalent to the reference source for the associated stage,
   a parallel to serial shift register,
   means coupling the shift register to each one of the stages to receive a binary value from each stage upon the closure of an associated electronic switch in accordance with the output of the comparator for each stage, and
   clock means coupled to each of the electronic switches operative to close and open the electronic switches of alternate stages to transfer the charge from one stage to the next at precise times.

2. A converter according to claim 1 wherein each single electronic storage device is a capacitor.

3. A converter according to claim 1 wherein each electronic storage device is a potential well.

4. A converter according to claim 2 wherein the comparator governed means for each stage includes a second electronic switch operative to couple its associated capacitor between the charge from the preceding stage and a first predetermined electrical value when the second electronic switch is in one position and between said charge and the reference source for its associated stage when the second electronic switch is in the other position to subtract the value of the reference source from said charge, and
   means coupling each clock pulse operating the first mentioned electronic switch for its associated stage to operate the second electronic switch to its other position only at times when the reference source and the charge from the storage device of the preceding stage is of a predetermined relationship.

5. A converter according to claim 3 wherein the comparator governed means for each stage includes a second potential well configured to store a predetermined charge, a second electronic switch operative to couple the first mentioned potential well to the second potential well to govern the second potential well of each stage to store a predetermined portion of the charge from the first mentioned potential well of the preceding stage only at times when the second electronic switch is in an operated position, and
   means coupling each clock pulse operating the first mentioned electronic switch for its associated stage to operate the second electronic switch to its operated position only at times when the reference source and the charge from the first mentioned storage device of the preceding stage is of a predetermined value.

6. An analog-to-digital converter for providing a binary output indicative of an analog input comprising, a pulse generator to generate repetitive pulse signals at a predetermined rate; a plurality of conversion stages; a register having a plurality of digital inputs corresponding to the number of conversion stages for producing the binary output; each of said conversion stages including,
   a. an analog input,
   b. an analog output,
   c. a reference source, said reference source being of a different predetermined value in accordance with the reference value of the preceding stage,
   d. a comparator having one input coupled to the analog output of the preceding stage and another input coupled to the reference source to generate at its output a signal of one level when the analog output of the preceding stage exceeds the reference source and to generate at its output a signal of another level when the reference source exceeds the analog output of the preceding stage, e. a digital output connecting the output of the comparator to one of the register inputs, f. a single electronic storage device, g. means including a first electronic switch responsive to the output of the comparator and each pulsed signal to govern the storage device to store an analog value corresponding to the reference source value subtracted from the analog input value only during the presence of the pulsed signal at times when the analog input exceeds the reference value, h. a second electronic switch operated to its one condition during the presence of each pulsed signal coupling the analog input and electronic storage device to the electronic storage device and analog output of the preceding stage only at times when the switch is in its said one condition to store an analog value corresponding to the stored value of the preceding stage storage device, and whereby all or a portion of the analog input is transferred from stage to stage in response to each pulse from the pulse generator, and each stage provides one bit of the binary output, said portion being the reference value subtracted from the analog input value.

7. A converter according to claim 6 wherein the storage device is a capacitor.

8. A converter according to claim 6 wherein the storage device is a potential well.

9. A converter according to claim 7 further comprising a device for converting the voltage to a charge at the analog input of the first stage.

10. A converter according to claim 6 wherein the means including the first electronic switch comprises an electronic gate having one input coupled to the comparator output and another input coupled to the pulse generator to operate the first electronic switch to its one condition in accordance with the output of the comparator only during the occurrence of a signal pulse.

11. A converter according to claim 10 wherein the means including the first electronic switch includes a potential well operative to accept a predetermined charge coupled to the output of the AND gate only a times when the first electronic switch is in its one condition.

12. A converter according to claim 6 wherein the pulse generator produces at least a first and second phase signal occurring alternately, each phase being operatively connected to alternate stages.

* * * * *